United States Patent [19]

Mracek

[11] 4,081,654
[45] Mar. 28, 1978

[54] METHODS AND APPARATUS FOR SELECTIVELY REMOVING A METALLIC FILM FROM A METALLIZED SUBSTRATE

[75] Inventor: Jaroslav Mracek, Lawrence Township, Mercer County, N.J.

[73] Assignee: Western Electric Co., Inc., New York, N.Y.

[21] Appl. No.: 754,294

[22] Filed: Dec. 27, 1976

[51] Int. Cl.² ............................................. B23K 9/00
[52] U.S. Cl. ............................................. 219/121 LM
[58] Field of Search .... 219/121 L, 121 LN, 121 EM; 204/192

[56] References Cited

U.S. PATENT DOCUMENTS

| | | | |
|---|---|---|---|
| 3,156,810 | 11/1964 | Samuelson | 219/121 L |
| 3,742,182 | 6/1973 | Saunders | 219/121 LM |
| 3,924,533 | 12/1975 | Gaynor | 101/467 |

OTHER PUBLICATIONS

IBM Bulletin, vol. 3, #2, July 1970, p. 362.

Primary Examiner—J. V. Truhe
Assistant Examiner—Fred E. Bell
Attorney, Agent, or Firm—D. J. Kirk

[57] ABSTRACT

A metallized substrate is flexed to conform to the surface of a segment of a right circular cylinder. The metallized substrate is arcuately rotated and a planar apertured mask is simultaneously moved linearly in spaced tangential relationship to the flexed substrate. A laser beam is directed through the apertured mask to traverse a line formed by the intersection of a plane parallel to the planar apertured mask and tangent to the flexed metallized substrate. As the metallized substrate and the apertured mask are moved, the laser beam is continuously reciprocated along the line to raster scan the metallized substrate through the apertured mask to remove metal therefrom in a desired pattern.

8 Claims, 7 Drawing Figures

METHODS AND APPARATUS FOR SELECTIVELY REMOVING A METALLIC FILM FROM A METALLIZED SUBSTRATE

BACKGROUND OF THE INVENTION

1. Field of the Invention

This invention relates to methods and apparatus for the removal of a metallic film from an insulative substrate. In particular, the invention is directed to the selective removal of portions of the metallic film using a beam of coherent light energy.

2. Description of the Prior Art

It is well known to selectively remove metallic coatings from an insulative substrate using a coherent laser beam; for example, see U.S. Pat. No. 3,911,444 to Lou et al. which issued on Oct. 7, 1975. This patent discloses the use of a laser beam to scan a metallized substrate. The laser beam is modulated to vaporize predetermined portions of the metallic coating. The remaining metal defines an electrical connecting pattern for printed wiring boards, or the like.

In addition to the modulation of the laser beam to remove predetermined portions of the metallic film, it is known to interpose an apertured mask between the laser source and the metallized substrate as disclosed in copending U.S. patent application Ser. No. 754,293 to Koo et al., filed of even date herewith and assigned to the same assignee as the instant application. In that application, the apertured mask is described as being placed proximate the metallized substrate and the surface of the metallized substrate raster scanned through the mask. Portions of the substrate metallization are selectively removed where the coherent laser beam passes through the mask apertures to form the desired metallized pattern on the substrate. A transparent material is placed in contact with the mask to protect the mask and receive the metal debris removed from the metallized substrate. By maintaining the apertured mask and metallized substrate in spaced relationship, the metal removed from the substrate does not redeposit on the substrate. Such redeposition of material on the substrate can result in undesirable low resistance paths and shorts between the electrical connecting paths after subsequent electroplating operations.

The apertured mask may be formed on a rigid, clear glass plate by selectively depositing areas of opaque material thereon which represent the circuit pattern to be formed on the substrate. The glass plate with the apertured mask thereon can be a quarter of an inch thick or more and presents a substantially planar surface. However, the metallized substrate is usually a sixteenth of an inch or less in thickness, may have a surface area of over 400 square inches, and cannot readily be held in a planar orientation. Accordingly, it is not possible to place the apertured mask and metallized substrate in spaced planar parallel relationship for there will always be substantial variation in the distance therebetween due to the unevenness of the metallized substrate.

When the mask-to-substrate distance varies in this manner, the definition of the resulting circuit pattern is adversely affected due to diffraction of the coherent light beam. Additionally, such diffraction can result in an undesirable change in the intensity of light impinging on a given area of the metallized substrate, resulting in damage to the substrate or in a little or no removal of the metal which is manifested as shorts in the connecting paths printed wiring board.

SUMMARY OF THE INVENTION

The instant invention precludes the foregoing problems with a method of selectively removing metal from a metallized substrate with a laser beam by flexing the metallized substrate to conform to a segment of a right circular cylinder, positioning a planar apertured mask in a plane which is in spaced tangential relation to the flexed substrate, and scanning the laser beam, through the apertured mask, along a line on the surface of the flexed substrate formed by the intersection of a plane parallel to the mask and tangential to the flexed metallized substrate, to selectively remove the metal from the substrate.

Additionally, the flexed substrate can be arcuately rotated while simultaneously moving the apertured planar mask in the spaced tangential plane. The laser beam is then repeatedly scanned, through the apertured mask, along the line to raster scan the moving metallized substrate to selectively remove the metal therefrom.

Apparatus to implement the foregoing method comprises means for flexing the metallized substrate to form a segment of a right circular cylinder, means for positioning a planar apertured mask in a plane which is in spaced tangential relation to the flexed substrate, and means for scanning the laser beam through the apertured mask, along a line on the surface of the flexed substrate formed by the intersection of a plane parallel to the mask and tangential to the flexed substrate, to selectively remove the metal from the substrate.

DETAILED DESCRIPTION

Figure 1:
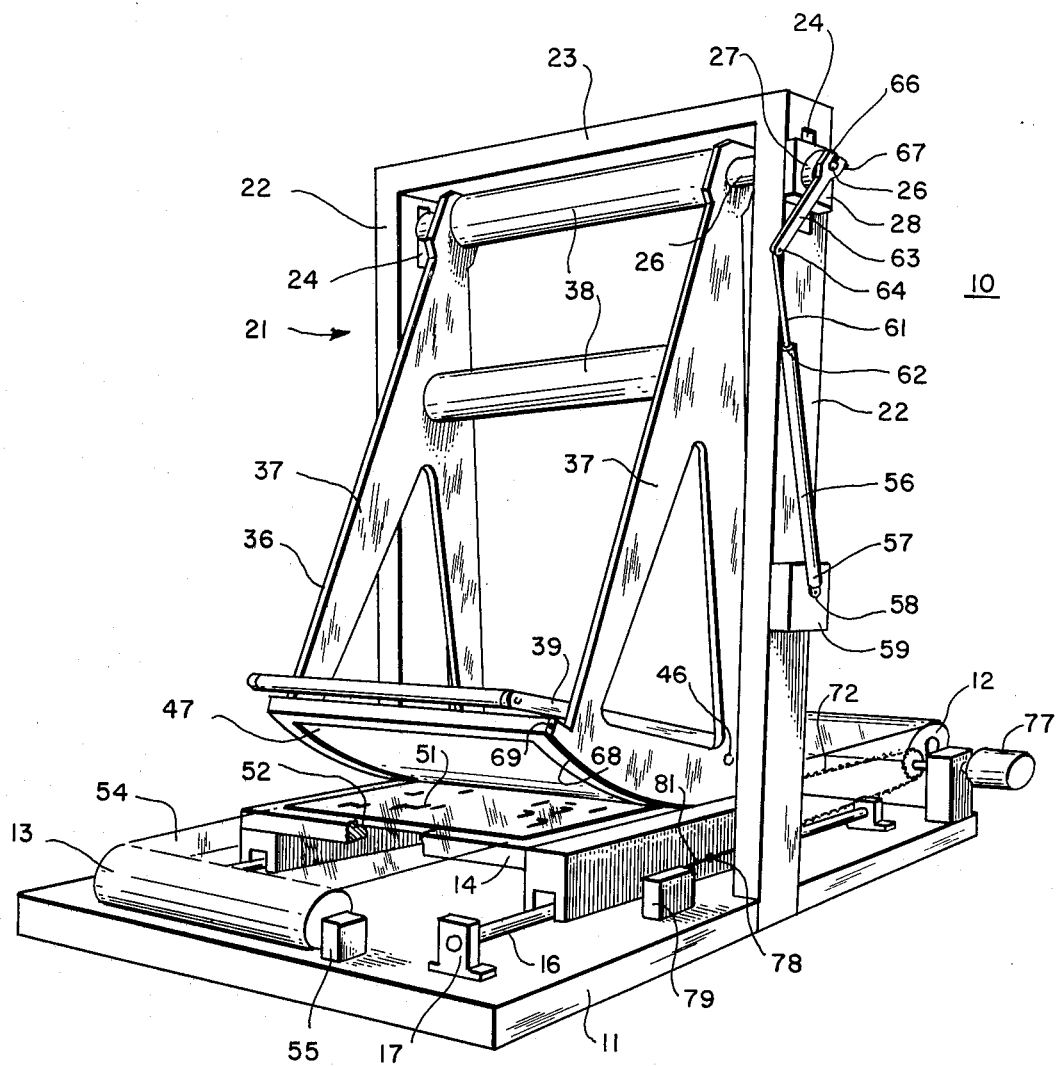
FIG. 1 is an isometric view of the instant laser pattern generation apparatus.

An apparatus used to selectively remove a metallic coating from insulative substrates to form printed wiring boards (PWB's) is generally indicated by the numeral 10 in FIG. 1. The apparatus 10 is comprised of a base 11 with a film feed and a take-up roll 12 and 13, respectively, mounted thereon. A mask support member 14 is movably mounted on a pair of parallel guide rods 16—16 which are fixedly mounted to the base 11 by a plurality of support members 17—17.

A yoke, generally designated by the numeral 21, is comprised of a pair of vertical legs 22—22 which are connected by a crossarm 23. The lower ends of the legs 22—22 are fixedly mounted to the base 11. The legs 22—22 have vertical slots 24—24 therein through which a pivot shaft 26 extends and is seated in a pair of bearings 27—27 which are supported by support blocks 28—28.

The pivot shaft 26 pivotably supports a rotatable substrate carrier 36. The carrier 36 has a pair of spaced sides 37—37 which are fixedly connected by crossmembers 38—38. At the lower end of the carrier 36 is a clamping member 39 which is hingeably mounted between sides 37—37 on a hinge rod 46. As can best be seen in the partial views of FIGS. 5 and 6, the clamping member 39 may be pulled upward (see FIG. 6) and a metallized substrate 47 placed within the carrier 36 resting on a curved ridge 48 of the mask support member 14. The curved ridge 48 has the shape of an arc of a circle having a radius which is the distance between a point on the arc and the axis of the pivot shaft 26. With the substrate 47 in place the clamping member 39 is then brought into a downward or closed position (see FIG. 5) which urges the metallized substrate into intimate contact with the ridge 48 causing the substrate to conform to the shape of a segment of a right circular cylinder. A handle 49 is located on clamping member 39 to facilitate the raising or lowering of the member.

Figure 2:
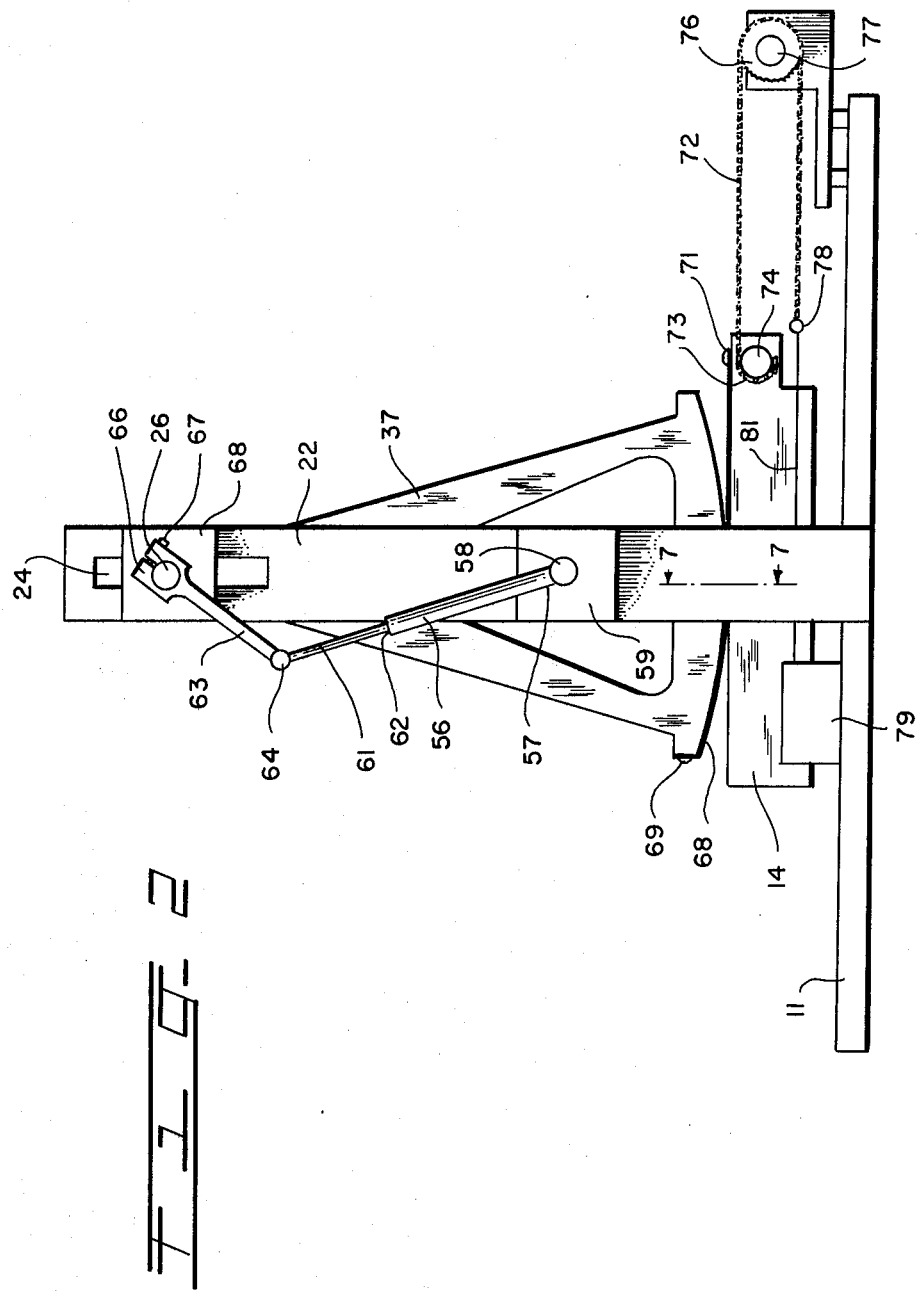
FIG. 2 is a side schematic view of the drive system of the instant apparatus.
Figure 7:
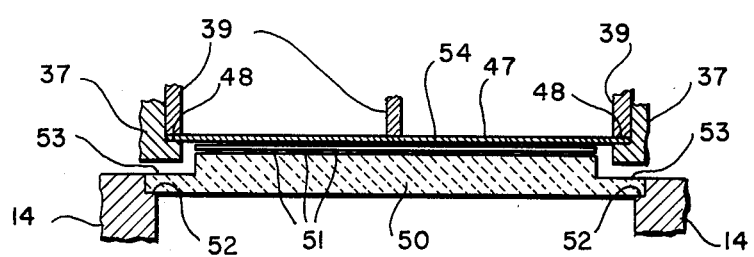
FIG. 7 is a cross-sectional view of the metallized substrate and mask.

FIG. 7 is a partial cross-sectional view taken in a vertical plane indicated by the line 7—7 in FIG. 2. A glass plate 50 (also see FIG. 1) having an apertured mask 51 thereon is seated on a shoulder 52 of the mask support member 14. The glass plate 50 has a pair of lateral grooves 53—53 to permit vertical adjustment of the distance between the mask and the metallized substrate 47 by lowering or raising the substrate carrier 36. A sheet of transparent material 54, such as Mylar (Trademark of E. I. DuPont de Nemours) is stretched between the feed roll 12 and the take-up reel 13 and is controlled by the operation of a motor 55. The transparent material 54 is normally in contact with the apertured mask 51, during operation, and may be held securely in place by vacuum (not shown).

FIG. 2 is a side elevation schematic of the apparatus drive system. A gas spring 56 has a first end 57 rotatably mounted on a pin 58 which is attached to a plate 59 which, in turn, if fixedly mounted to leg 22. A rod 61 slidably projects from a second end 62 of the gas spring 56 and is hingeably connected to an extension rod 63 by a hinge pin 64. The extension rod 63 has a bifurcated end 66 into which the pivot shaft 26 projects and is clamped therein by a set screw 67.

- A metal band 68 has a first end 69 fixedly connected to the substrate carrier 36 with a second end 71 fixedly mounted to the slidable mask support member 14. A chain 72 has a first end 73 fixedly connected to an anchor 74 on the slidable mask support member 14. The chain 72 engages a toothed sprocket 76 mounted to a one-directional clutch which is driven by a motor 77. The second end 78 of the chain 72 is attached to a take-up motor 79 by a cable 81. Both motors 77 and 79 are permanently mounted on the base 11.

Figure 3:
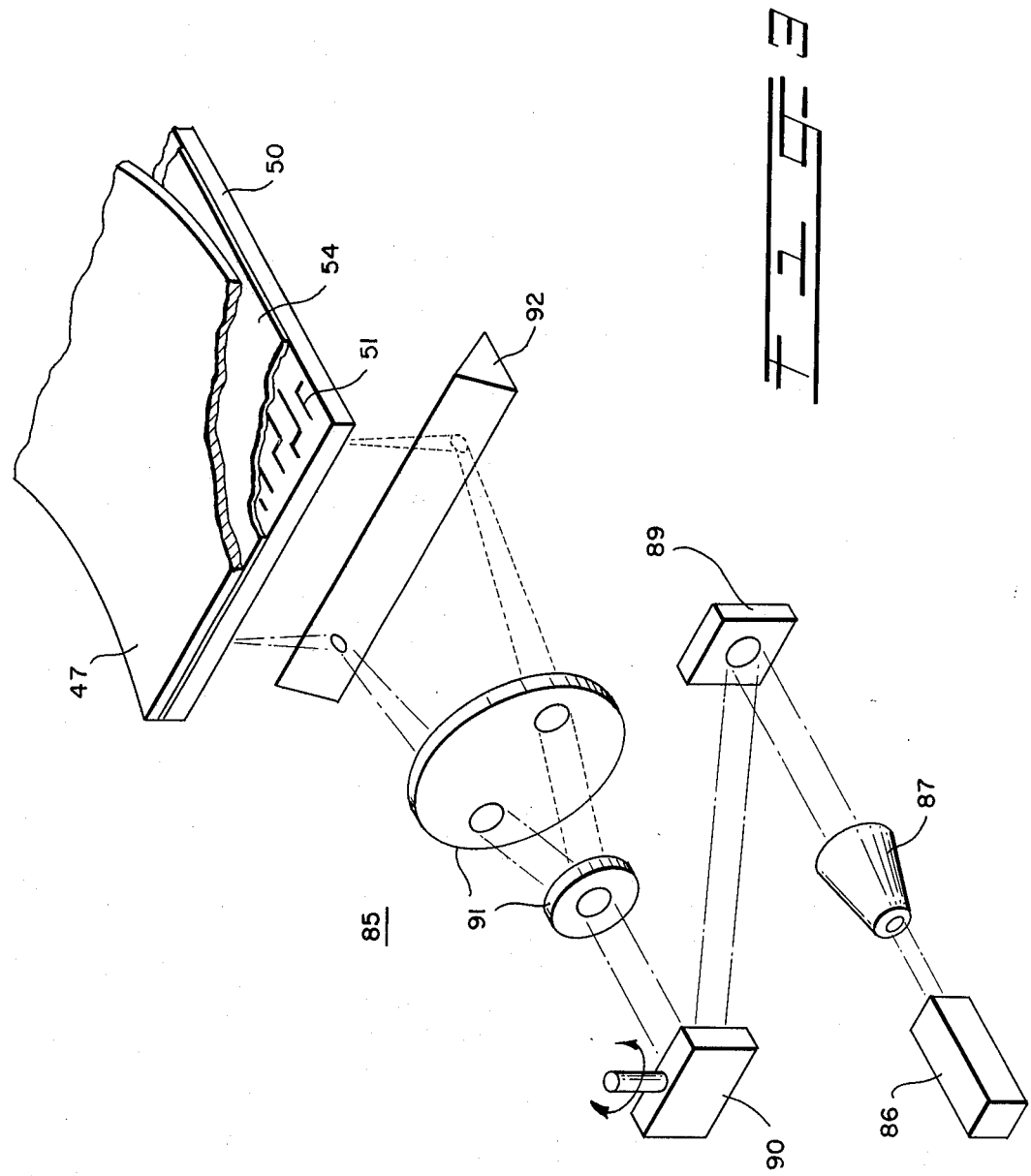
FIG. 3 is a schematic diagram of the laser generation system associated with the instant pattern generation apparatus.
Figure 5:
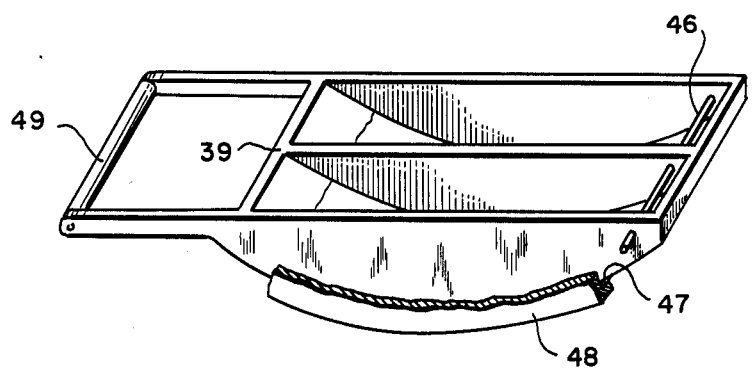
FIGS. 5 and 6 depict the flexing of the metallized substrate by a clamping member.
Figure 6:
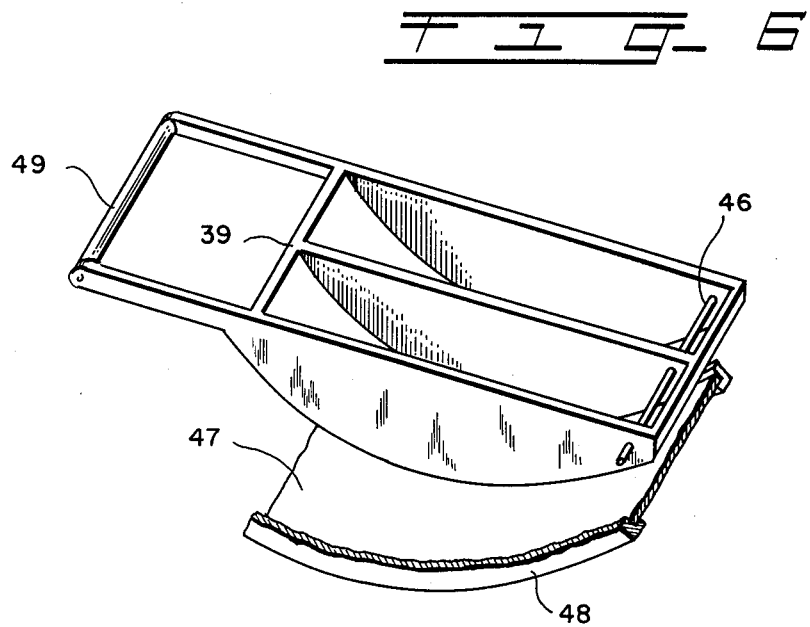

A laser generation system, generally designated by the numeral 85 in the partial schematic drawing of FIG. 3, provides a means for repetitively scanning a line on the metallized surface of the metallized substrate 47. A laser beam from laser source 86 is directed through a beam expander 87 and reflected from a first fixed mirror 89 onto a galvanometer deflection device 90 and through a scanning lens arrangement 91 and then reflected from a second fixed mirror 92 and focused through the apertured mask 51 onto the metallic coating of the substrate 47. The laser generation system 85 is located on the base 11, under the glass plate 50 and can best be seen in the partial schematic diagram of FIG. 4.

prior to the operation of the apparatus 10, the clamping member 39 is pulled upward and a metallized substrate 47 placed on the curved ridge 48 as shown in FIG. 6; the clamping member is then moved downward and locked in place causing the metallized substrate to be flexed to conform to a segment of the surface of a right circular cylinder as shown in FIG. 5.

Once the metallized substrate 47 is locked into position in the substrate carrier 36 an operator using the handle 49 pushes the carrier in a counterclockwise direction (as viewed in FIG. 2) causing the pivot shaft 26 to rotate in a counterclockwise direction overcoming the bias of the gas spring 56. The counterclockwise movement of the substrate carrier 36 permits slack in the metal band 68 which allows the mask support member 14 to be pulled to the right (FIG. 2) by the chain 72 and the cable 81 under the control of the motor 79. This movement is continued until the substrate carrier is substantially in the position shown in FIG. 4. Once in this position, the operator releases the substrate carrier 36 and the gas spring 56 forces the rod 61 out and transmits a clockwise torque to the pivot shaft 26. This results in a clockwise rotational movement of the substrate carrier 36 which provides a pulling force via the metal band 68 that causes the mask support member 14 to simultaneously move to the left as viewed in FIG. 2. The speed of the movement of the mask support member 14 is held constant by the motor 77.

Just prior to the clockwise movement of the substrate carrier 36, the laser 86 is activated and the laser beam expanded in the expander 87 (see FIG. 3) reflected by mirror 89 onto the galvanometer 90 which laterally scans the beam onto mirror 92 via the scanning lens 91—91. The laser beam is reflected upward from the mirror 92 through the apertures of the mask 51 and the transparent material 54 onto the metallized substrate 47 to cause the selective removal of the metallization as hereinbefore discussed.

It has been found to be most advantageous to maintain the metallized substrate 47 and the mask 51 in spaced relationship. The reason for this being that as the laser removes metal from the substrate 47, there is a tendency for the metal to redeposit on the substrate resulting in shorts in the final printed circuit after later electroplating operations. Such redepositing of material on the substrate 47 has been found to be substantially eliminated by spacing the metallized substrate and the mask 50 apart. The metal removed from the metallized substrate 47 is deposited on the transparent material 54 which may be removed and replaced prior to removing metal from a subsequent metallized substrate.

By flexing the metallized substrate 47 to conform to a segment of a right circular cylinder the line formed by a plane parallel to the apertured mask 51 and tangent to the flexed substrate will be parallel to the plane of the planar mask. Accordingly, the distance travelled by the laser beam from the mask 51 to the line on the flexed substrate 47 is substantially constant at all points of the lateral scan of the laser. By maintaining the mask 51-to-substrate 47 distance constant, diffraction effects are minimized resulting in good pattern definition. Additionally, the intensity of laser light impinging on a given area of the metallized substrate 47 is also constant which permits a more accurate control of the amount of metal removed which, in turn, minimizes damage to the substrate and/or the possibility of short circuits between connecting paths on the printed wiring board.

Figure 4:
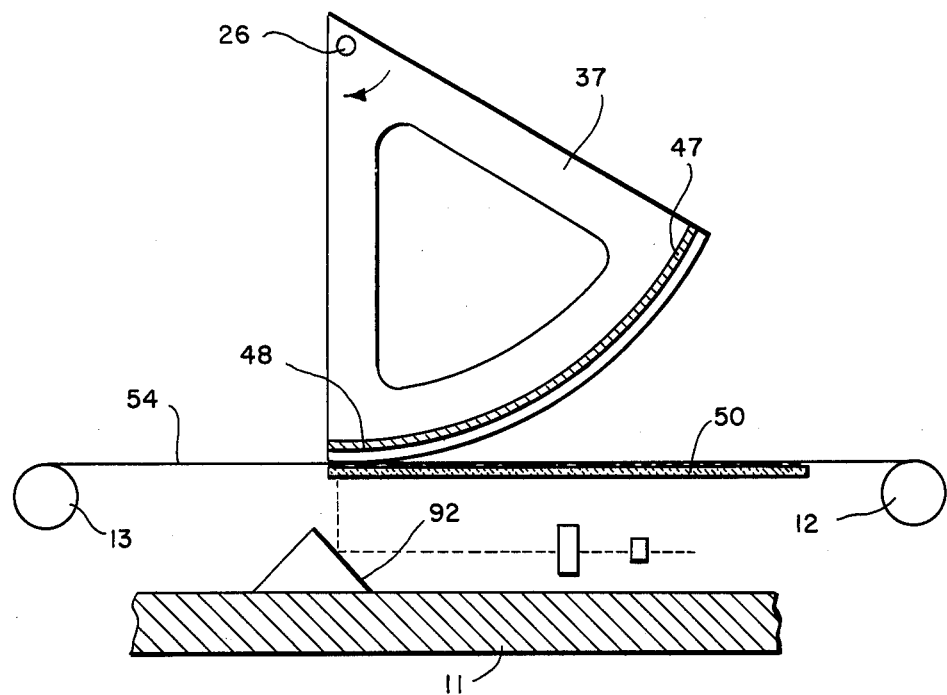
FIG. 4 is a side schematic view of the instant apparatus at the initiation of operation.

As can be clearly seen in FIG. 4, the metallized substrate 47 is raster scanned through the apertured mask 51 as the mask moves to the left and the metallized substrate 47 moves clockwise (FIG. 2). Most important is the fact that the laser beam is always scanning the metallized substrate 47 along a line formed by a plane which is tangent to the flexed metallized substrate 47 and parallel to the plane of the mask 51. The imaginary line so formed will be, at all times, a substantially constant distance from the surface of the mask 51 as hereinbefore described.

In a particular exemplary embodiment of the instant invention, the metallized substrate 47 was 18 inches by 24 inches by one-sixteenth of an inch with a copper coating of 1000 A. thick. The insulative portion of the substrate was comprised of epoxy glass. The distance between the substrate 47 and the metallized mask 51 was held at 5 mils. The substrate carrier 14 moved at a speed of 0.2 inch per second, while the laser beam scanned at a lateral speed of approximately 200 inches per second. The transparent material 54 was a Mylar film which was approximately one mil thick. The removed copper was deposited on the transparent material 54 which then was taken up by take-up roll 13 and a fresh section of material placed in contact with the surface of the mask 51 preparatory to the placement of the next metallized substrate 47 in the carrier 36.

The apertured mask 51 was 18 inches by 24 inches and formed on a plate one-fourth of an inch thick of clear glass. The mask pattern was made of copper of 10,000 A. thick and formed by an etching process. The overall dimensions of the base 11 were 60 inches long by 30 inches wide and the height of the yoke 21 was approximately 52 inches.

The laser used to implement the instant invention may be either continuous or pulsed. In a specific embodiment the laser was a focused continuous wave Nd:YAG.

What is claimed is:

1. A method of selectively removing metal from a metallized substrate with a laser beam, comprising the steps of:
   flexing the metallized substrate to form a segment of a right circular cylinder;
   positioning an apertured planar mask in a plane which is in spaced tangential relation to the flexed substrate; and
   scanning the laser beam, through the apertured mask, along a line on the surface of the flexed substrate formed by the intersection of a plane parallel to the mask and tangential to the flexed metallized substrate, to selectively remove the metal from the substrate.

2. The selective removal method as set forth in claim 1, which further comprises the steps of:
   moving the flexed metallized substrate along the circumference of the cylinder;
   simultaneously moving the apertured planar mask in the spaced tangential plane; and
   repeatedly scanning the laser beam, through the apertured mask, along the line to raster scan the moving metallized substrate to selectively remove the metal therefrom.

3. The method as set forth in claim 1, characterized by:
   interposing a sheet of transparent material between the mask and the metallized substrate to receive the metal removed from the metallized substrate.

4. The method as set forth in claim 3, wherein:
   the sheet of transparent material is in intimate contact with the mask.

5. An apparatus for selectively removing metal from a metallized substrate, comprising:
   means for flexing the metallized substrate to form a segment of a right circular cylinder;
   means for positioning a planar apertured mask in a plane which is in spaced tangential relation to the flexed substrate; and
   means for scanning the laser beam through the apertured mask, along a line on the surface of the flexed substrate formed by the intersection of a plane parallel to the mask and tangential to the flexed metallized substrate, to selectively remove the metal from the substrate.

6. The apparatus as set forth in claim 5 which further comprises:
   means for moving the flexed metallized substrate along the circumference of the cylinder;
   means for simultaneously moving the planar apertured mask in the spaced tangential plane; and
   means for repeatedly scanning the laser beam through the apertured mask along the line to raster scan the moving metallized substrate to selectively remove the metal therefrom.

7. The apparatus as set forth in claim 5 which further comprises:
   means for interposing a sheet of transparent material between the apertured mask and the metallized substrate to receive the metal removed from the metallized substrate.

8. The apparatus as set forth in claim 5 wherein the flexing means is a carrier, which comprises:
   first and second spaced and aligned sides, each side having the shape of a sector of a circle with an inwardly facing shoulder curved to form a segment of a circle; and
   a rotatable clamp, hingeably mounted between the first and second sides, to urge the metallized substrate into flexed intimate contact with curved shoulders to conform the metallized substrate to a segment of a cylinder.

* * * * *